(12) United States Patent
Ko et al.

(10) Patent No.: US 9,312,011 B1
(45) Date of Patent: Apr. 12, 2016

(54) DATA WRITING METHOD, MEMORY STORAGE DEVICE AND MEMORY CONTROL CIRCUIT UNIT

(71) Applicant: PHISON ELECTRONICS CORP., Miaoli (TW)

(72) Inventors: Hong-Lipp Ko, Miaoli County (TW); Kheng-Joo Tan, Miaoli County (TW); Teng-Chun Hsu, Pingtung County (TW); Chia-Hung Chien, Kaohsiung City (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/556,255

(22) Filed: Dec. 1, 2014

(30) Foreign Application Priority Data

Oct. 6, 2014 (TW) .............................. 103134737 A

(51) Int. Cl.
*G11C 16/14* (2006.01)
(52) U.S. Cl.
CPC ...................... *G11C 16/14* (2013.01)
(58) Field of Classification Search
CPC ...................................................... G11C 16/14
See application file for complete search history.

(56) References Cited

U.S. PATENT DOCUMENTS

| 5,473,569 | A | * | 12/1995 | Chwu | ................. | G11C 16/102 365/185.11 |
| 2008/0219053 | A1 | * | 9/2008 | Kim | .................... | G11C 16/0483 365/185.11 |
| 2011/0087827 | A1 | * | 4/2011 | Yeh | ..................... | G06F 12/0246 711/103 |
| 2012/0210075 | A1 | * | 8/2012 | Yeh | ..................... | G06F 12/0246 711/154 |
| 2014/0047169 | A1 | * | 2/2014 | Seo | ..................... | G06F 12/0246 711/103 |

* cited by examiner

*Primary Examiner* — Khamdan Alrobaie
(74) *Attorney, Agent, or Firm* — Jianq Chyun IP Office

(57) ABSTRACT

A data writing method, a memory storage device, and a memory control circuit unit are provided. The method includes: writing data into at least one first logical unit and at least one second logical unit, and the data includes first data and second data; storing first data into at least one first physical erasing unit and filling the first physical erasing unit with the first data; storing second data into at least one second physical erasing unit; determining whether a remaining space of each second physical erasing unit is less than a threshold; if the remaining space of one of the at least one second physical erasing unit is less than the threshold, selecting at least one fourth physical erasing unit from a spare area and writing the second data into the at least one second physical erasing unit and the at least one fourth physical erasing unit.

21 Claims, 14 Drawing Sheets

DATA WRITING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 103134737, filed on Oct. 6, 2014. The entirety of the above-mentioned patent application is hereby incorporated by reference herein and made a part of this specification.

BACKGROUND

1. Technology Field

The invention relates to a data writing method. More particularly, the invention relates to a data writing method, a memory storage device, and a memory control circuit unit.

2. Description of Related Art

Digital cameras, mobile phones, and MP3 players have undergone rapid growth in recent years, so that consumers' demands for storage media have also increased drastically. Since a rewritable non-volatile memory is characterized by non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage device which utilizes a flash memory as its storage medium. Therefore, the flash memory industry has become a very popular part of the electronic industry in recent years.

When a flash memory device stores sequential data, plural physical erasing units are sequentially filled with the sequential data, and the rest of the sequential data not sufficient to fill one physical erasing unit is written into one specific physical erasing unit. During the next operation of writing the sequential data, the remaining space in the specific physical erasing unit is not enough, such that the rest of the sequential data will be stored into another specific physical erasing unit. At this time, a merging operation on the two specific physical erasing units is required. While the merging operation is being performed, an erasing operation is also performed on the specific physical erasing unit, thus reducing the efficiency of repeatedly writing the sequential data. The data writing method provided herein has thus been proposed to enhance the efficiency of repeatedly writing the sequential data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a data writing method, a memory storage device, and a memory control circuit unit capable of reducing the number of times of performing merging operations and further enhancing the efficiency of writing the sequential data.

In an exemplary embodiment of the invention, a data writing method for controlling a rewritable non-volatile memory module is provided, wherein the rewritable non-volatile memory module includes a plurality of physical erasing units, and the physical erasing units are at least grouped into one data area and one spare area. The data writing method includes: allocating a plurality of logical units, wherein at least one first logical unit of the logical units is mapped to at least one first physical erasing unit of the physical erasing units in the data area, at least one second logical unit of the logical units is mapped to at least one second physical erasing unit of the physical erasing units in the data area, the at least one first physical erasing unit stores first data and is filled with the first data, and the at least one second physical erasing unit stores second data and is not filled with the second data; selecting at least one third physical erasing unit of the physical erasing units from the spare area and determining whether a remaining space in the at least one second physical erasing unit is smaller than a threshold; if the remaining space in the at least one second physical erasing unit is not smaller than the threshold, issuing a first writing command sequence, wherein the first writing command sequence indicates to write the first data into the at least one third physical erasing unit and indicates to write the second data into the at least one second physical erasing unit; if the remaining space in the at least one second physical erasing unit is smaller than the threshold, selecting at least one fourth physical erasing unit of the physical erasing units from the spare area and issuing a second writing command sequence, wherein the second writing command sequence indicates to write the first data into the at least one third physical erasing unit and indicates to write the second data into the at least one second physical erasing unit and the at least one fourth physical erasing unit.

In another exemplary embodiment of the invention, a memory storage device that includes a connection interface unit, a rewritable non-volatile memory module, and a memory control circuit unit is provided. The connection interface unit is configured for being coupled to a host system. The rewritable non-volatile memory module includes a plurality of physical erasing units. The physical erasing units are at least grouped into one data area and one spare area. The memory control circuit unit is coupled to the connection interface unit and the rewritable non-volatile memory module. The memory control circuit unit is configured to allocate a plurality of logical units. Here, at least one first logical unit of the logical units is mapped to at least one first physical erasing unit of the physical erasing units in the data area, and at least one second logical unit of the logical units is mapped to at least one second physical erasing unit of the physical erasing units in the data area. The at least one first physical erasing unit stores first data and is filled with the first data, and the at least one second physical erasing unit stores second data and is not filled with the second data. The memory control circuit unit is further configured to select at least one third physical erasing unit of the physical erasing units from the spare area and determine whether a remaining space in the at least one second physical erasing unit is smaller than a threshold. If the remaining space in the at least one second physical erasing unit is not smaller than the threshold, the memory control circuit unit is further configured to issue a first writing command sequence. Here, the first writing command sequence indicates to write the first data into the at least one third physical erasing unit and indicates to write the second data into the at least one second physical erasing unit. If the remaining space in the at least one second physical erasing unit is smaller than the threshold, the memory control circuit unit is further configured to select at least one fourth physical erasing unit of the physical erasing units from the spare area and issue a second writing command sequence. Here, the second writing command sequence indicates to write the first data into the at least one third physical erasing unit and indicates to write the second data into the at least one second physical erasing unit and the at least one fourth physical erasing unit.

In another exemplary embodiment of the invention, a memory control circuit unit configured to control a rewritable non-volatile memory module is provided. The rewritable non-volatile memory module includes a plurality of physical erasing units, and the physical erasing units are at least grouped into one data area and one spare area. The memory control circuit unit includes a host interface, a memory interface, and a memory management circuit. The host interface is configured for being coupled to a host system. The memory interface is configured for being coupled to the rewritable non-volatile memory module. The memory management circuit is coupled to the host interface and the memory interface. The memory management circuit is configured to allocate a plurality of logical units. Here, at least one first logical unit of the logical units is mapped to at least one first physical erasing unit of the physical erasing units in the data area, and at least one second logical unit of the logical units is mapped to at least one second physical erasing unit of the physical erasing units in the data area. The at least one first physical erasing unit stores first data and is filled with the first data, and the at least one second physical erasing unit stores second data and is not filled with the second data. The memory management circuit is further configured to select at least one third physical erasing unit of the physical erasing units from the spare area and determine whether a remaining space in the at least one second physical erasing unit is smaller than a threshold. If the remaining space in the at least one second physical erasing unit is not smaller than the threshold, the memory management circuit is further configured to issue a first writing command sequence, wherein the first writing command sequence indicates to write the first data into the at least one third physical erasing unit and indicates to write the second data into the at least one second physical erasing unit. If the remaining space in the at least one second physical erasing unit is smaller than the threshold, the memory management circuit is further configured to select at least one fourth physical erasing unit of the physical erasing units from the spare area and issue a second writing command sequence. Here, the second writing command sequence indicates to write the first data into the at least one third physical erasing unit and indicates to write the second data into the at least one second physical erasing unit and the at least one fourth physical erasing unit.

In view of the above, plural sequential data may be written in no need of performing any merging operation, and the efficiency of writing data can be further enhanced.

It should be understood, however, that this Summary may not contain all of the aspects and embodiments of the invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
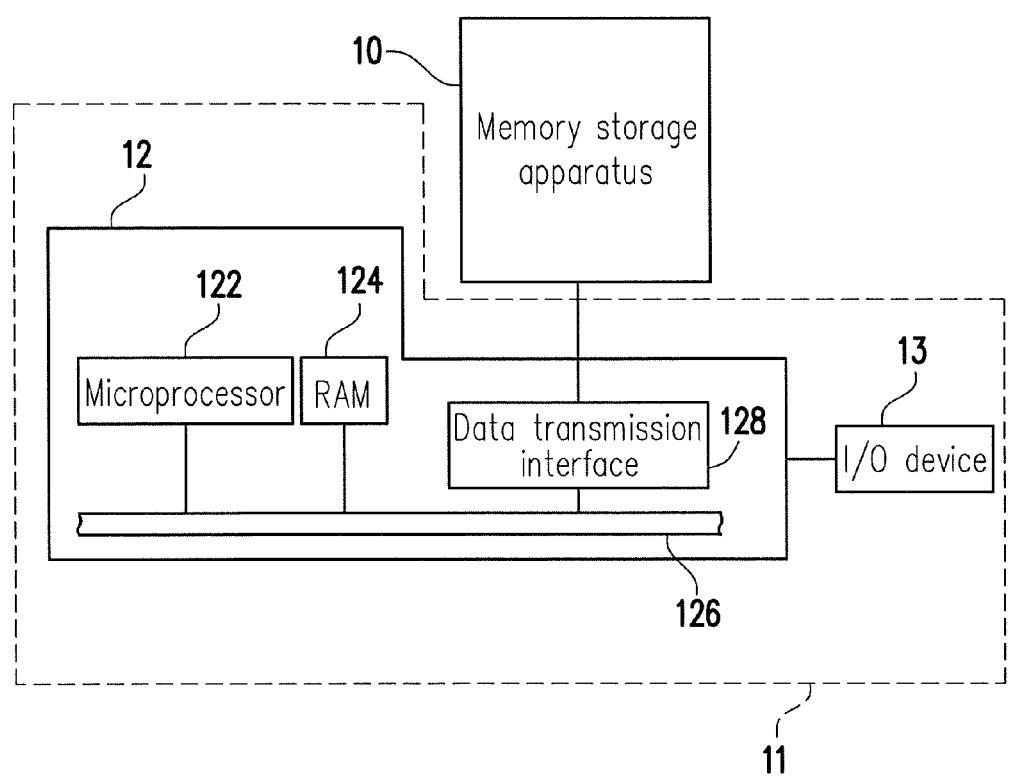
FIG. 1 is a schematic diagram illustrating a host system and a memory storage device according to an exemplary embodiment of the invention.

Reference will now be made in detail to the present exemplary embodiments of the invention, examples of which are illustrated in the accompanying drawings. Wherever possible, the same reference numbers are used in the drawings and the description to refer to the same or like parts. Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more," and "at least one" can be used interchangeably herein.

A memory storage device (also referred to as a memory storage system) typically includes a rewritable non-volatile memory module and a controller (also referred to as a control circuit). The memory storage device is usually used together with a host system, such that the host system can write data into or read data from the memory storage device.

Figure 2:
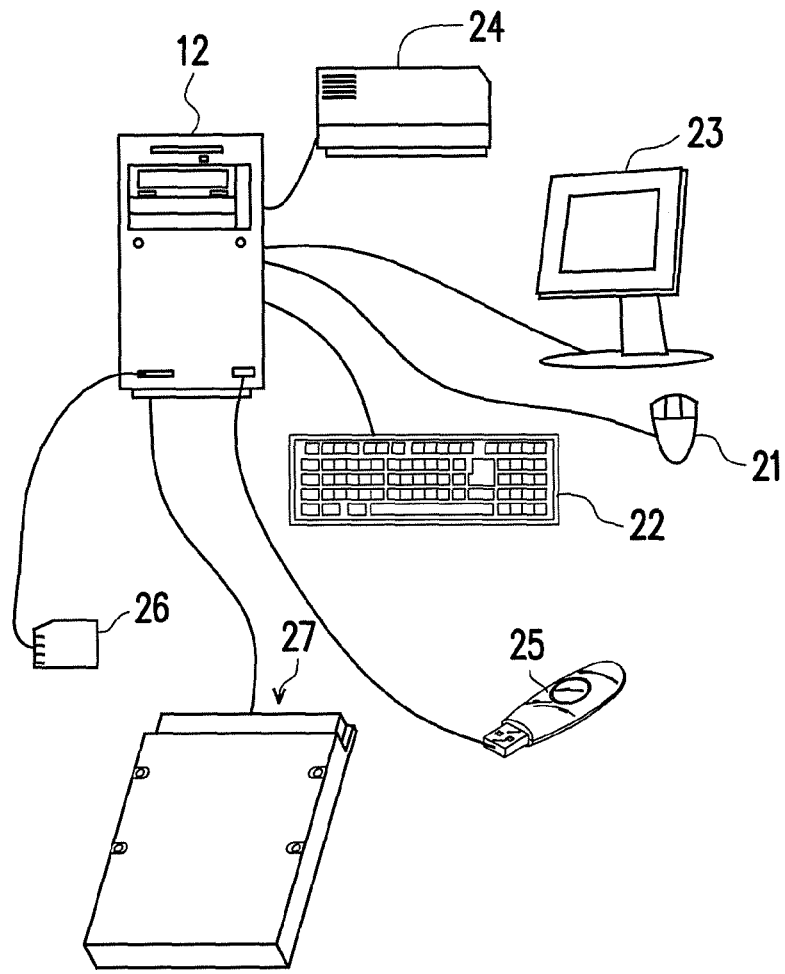
FIG. 2 is a schematic diagram illustrating a computer, an input/output (I/O) device, and a memory storage device according to an exemplary embodiment of the invention.

FIG. 1 is a schematic diagram illustrating a host system and a memory storage device according to an exemplary embodiment of the invention. FIG. 2 is a schematic diagram illustrating a computer, an input/output (I/O) device, and a memory storage device according to an exemplary embodiment of the invention.

With reference to FIG. 1, a host system 11 normally includes a computer 12 and an input/output (I/O) device 13. The computer 12 includes a microprocessor 122, a random access memory (RAM) 124, a system bus 126, and a data transmission interface 128. The I/O device 13 includes a mouse 21, a keyboard 22, a display 23, and a printer 24 as shown in FIG. 2. It should be understood that the I/O device 13 is not limited to include the devices shown in FIG. 2 and may further include other devices.

In an exemplary embodiment of the invention, the memory storage device 10 is coupled to other devices of the host system 11 through the data transmission interface 128. Through operating the microprocessor 122, the RAM 124, and the I/O device 13, the data can be written into or read from the memory storage device 10. For instance, the memory storage device 10 may be a rewritable non-volatile memory storage device, such as a flash drive 25, a memory card 26, or a solid state drive (SSD) 27 shown in FIG. 2.

Figure 3:
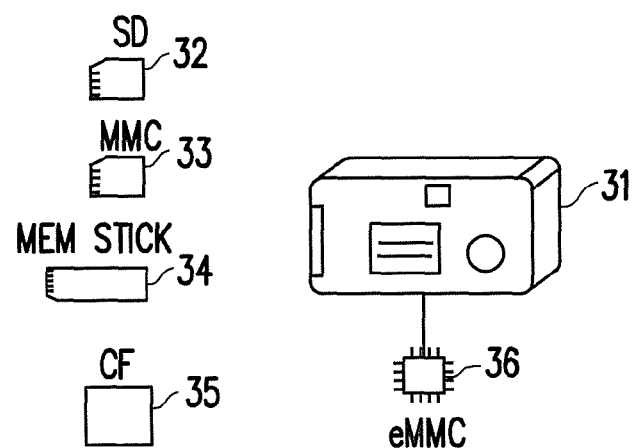
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system that can be substantially operated together with the memory storage device 10 to store data. In the present exemplary embodiment, although the host system 11 is described as a computer system, the host system 11 in another exemplary embodiment of the invention may be a digital camera, a video camera, a communication device, an audio player, a video player, and so forth. For instance, if the host system is a digital camera (video camera) 31, the rewritable non-volatile memory storage device is then an SD card 32, an MMC card 33, a memory stick 34, a CF card 35, or an embedded storage device 36 (as shown in FIG. 3). The embedded storage device 36 includes an embedded MMC (eMMC). It should be mentioned that the eMMC is directly coupled to the motherboard of the host system.

Figure 4:
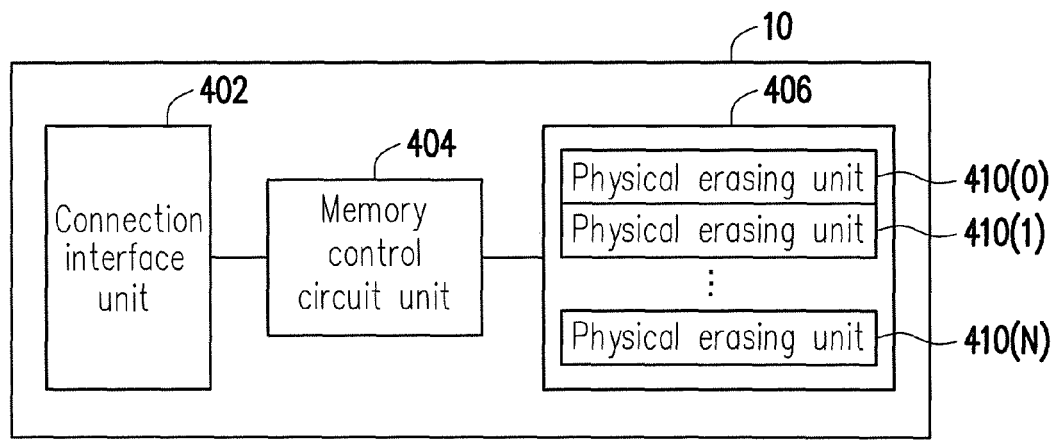
FIG. 4 is a simple block diagram illustrating the memory storage device depicted in FIG. 1.

FIG. 4 is a simple block diagram illustrating the memory storage device depicted in FIG. 1.

With reference to FIG. 4, the memory storage device 10 includes a connection interface unit 402, a memory control circuit unit 404, and a rewritable non-volatile memory module 406 that includes a plurality of physical erasing units 410(0)-410(N).

In the present exemplary embodiment, the connection interface unit 402 complies with the serial advanced technology attachment (SATA) standard. However, it should be understood that the invention is not limited thereto, and the connection interface unit 402 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the secure digital (SD) standard, the ultra high speed-I (UHS-I) interface standard, the ultra high speed-II (UHS-II) interface standard, the memory stick (MS) interface standard, the multi media card (MMC) interface standard, the eMMC interface standard, the universal flash storage (UFS) interface standard, the compact flash (CF) standard, the integrated device electronics (IDE) standard, or other suitable standards. The connection interface unit 402 and the memory control circuit unit 404 may be packaged into one chip, or the connection interface unit 402 may be arranged outside a chip having the memory control circuit unit 404.

The memory control circuit unit 404 is configured to execute a plurality of logic gates or control instructions implemented in a hardware form or a firmware form and perform various data operations (e.g., data writing, reading, and erasing) in the rewritable non-volatile memory module 406 according to commands issued by the host system 11.

The rewritable non-volatile memory module 406 is coupled to the memory control circuit unit 404 and configured for storing data written by the host system 11. Here, the rewritable non-volatile memory module 406 may be a single-level cell (SLC) NAND flash memory module, a multi-level cell (MLC) NAND flash memory module (i.e., a flash memory module capable of storing data of 2 bits in one memory cell), a trinary-level cell (TLC) NAND flash memory module (i.e., a flash memory module capable of storing data of 3 bits in one memory cell), other flash memory modules, or other memory modules having the same characteristics.

Figure 5:
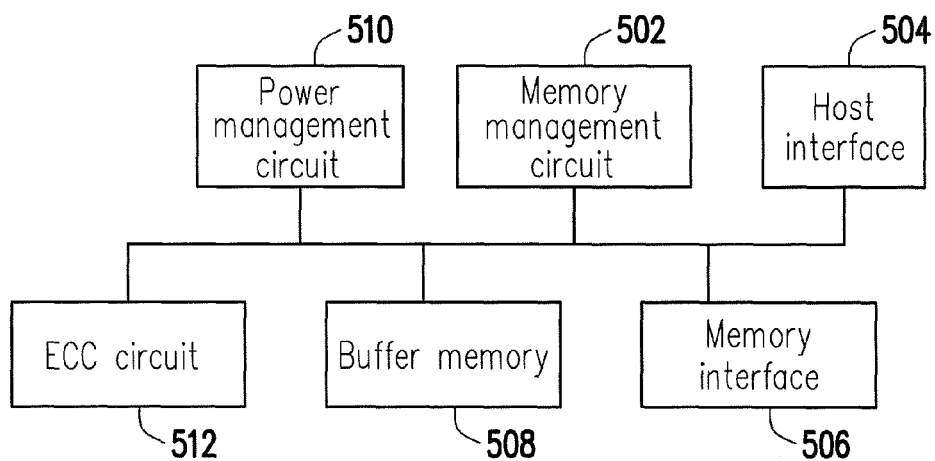
FIG. 5 is a simple block diagram illustrating a memory control circuit unit according to an exemplary embodiment of the invention.

FIG. 5 is a simple block diagram illustrating a memory control circuit unit according to an exemplary embodiment of the invention.

With reference to FIG. 5, the memory control circuit unit 404 includes a memory management circuit 502, a host interface 504, a memory interface 506, a buffer memory 508, a power management circuit 510, and an error checking and correcting (ECC) circuit 512.

The memory management circuit 502 is configured to control the overall operation of the memory control circuit unit 404. Particularly, the memory management circuit 502 has a plurality of control commands; when the memory storage device 10 is in operation, the control commands are executed to perform data writing, reading, and erasing operations. The operations of the memory management circuit 502 are described below; in case that the operations of the memory management circuit 202 are similar to those of the memory control circuit unit 404, the relevant descriptions will be omitted.

In the present exemplary embodiment, the control commands of the memory management circuit 502 are implemented in a firmware form. For instance, the memory management circuit 502 has a microprocessor unit (not shown) and a read-only memory (ROM, not shown), and these control instructions are burnt into the ROM. When the memory storage device 10 is in operation, the control commands are executed by the microprocessor unit to write, read, and erase data.

In another exemplary embodiment of the invention, the control commands of the memory management circuit 502 may also be stored in a specific area of the rewritable non-volatile memory module 406 (e.g., a system area of a memory module exclusively used for storing system data) in form of programming codes. Additionally, the memory management circuit 502 has a microprocessor unit (not shown), a ROM (not shown), and a RAM (not shown). In particular, the ROM has boot codes, and when the memory control circuit unit 404 is enabled, the microprocessor unit first executes the boot codes to load the control instructions from the rewritable non-volatile memory module 406 into the RAM of the memory management circuit 502. The microprocessor unit then runs the control commands to write, read, and erase data.

Moreover, the control commands of the memory management circuit 502 may also be implemented in a hardware form according to another exemplary embodiment of the invention. For instance, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage physical erasing units of the rewritable non-volatile memory module 406. The memory writing circuit is configured to issue a write command to the rewritable non-volatile memory module 406 for writing data thereto. The memory reading circuit is configured to issue a read command to the rewritable non-volatile memory module 406 for reading data therefrom. The memory erasing circuit is configured to issue an erasing command to the rewritable non-volatile memory module 406 for erasing data therefrom. The data processing circuit is configured to process data to be written to the rewritable non-volatile memory module 406 or data read from the rewritable non-volatile memory module 406.

The host interface 504 is coupled to the memory management circuit 502 and configured to receive and identify commands and data transmitted by the host system 11. Namely, the commands and data from the host system 11 are transmitted to the memory management circuit 504 through the host interface 502. In the present exemplary embodiment, the host interface 504 complies with the SATA standard. However, the invention is not limited thereto, and the host interface 504 may also comply with the PATA standard, the IEEE 1394 standard, the PCI express standard, the USB standard, the UHS-I interface standard, the UHS-II interface standard, the MS standard, the MMC standard, the CF standard, the IDE standard, or any other appropriate data transmission standard.

The memory interface 506 is coupled to the memory management circuit 502 and configured to access the rewritable non-volatile memory module 406. Namely, data to be written into the rewritable non-volatile memory module 406 may be converted by the memory interface 506 into a format acceptable to the rewritable non-volatile memory module 406. Specifically, if the memory management circuit 502 is about to access the rewritable non-volatile memory module 406, the memory interface 506 transmits corresponding command sequences. The corresponding command sequences may include one or more signals or data on the bus. For instance, a reading command sequence may include the read identification codes, memory addresses, and so forth.

The buffer memory 508 is coupled to the memory management circuit 502 and configured to temporarily store data and commands received from the host system 11 or data received from the rewritable non-volatile memory module 406. Besides, the buffer memory 508 may temporarily store the system management data used by the memory management circuit 502, such as a logical-physical mapping table, a logical-random physical sub-unit mapping table, and so on.

The power management circuit 510 is coupled to the memory management circuit 502 and configured to control the power supply of the memory storage device 10.

The ECC circuit 512 is coupled to the memory management circuit 502 and configured to perform an ECC procedure to ensure data accuracy. To be specific, when the memory management circuit 502 receives a writing command from the host system 11, the ECC circuit 512 generates an ECC code and/or an error detecting code (EDC) for data corresponding to the writing command, and the memory management circuit 502 writes the data and the corresponding ECC code and/or the corresponding EDC code into the rewritable non-volatile memory module 406. Subsequently, when the memory management circuit 502 reads the data from the rewritable non-volatile memory module 406, it also reads the ECC code and/or the EDC code corresponding to the data, and the ECC circuit 512 executes the ECC procedure on the data according to the ECC code and/or the EDC code.

Figure 6:
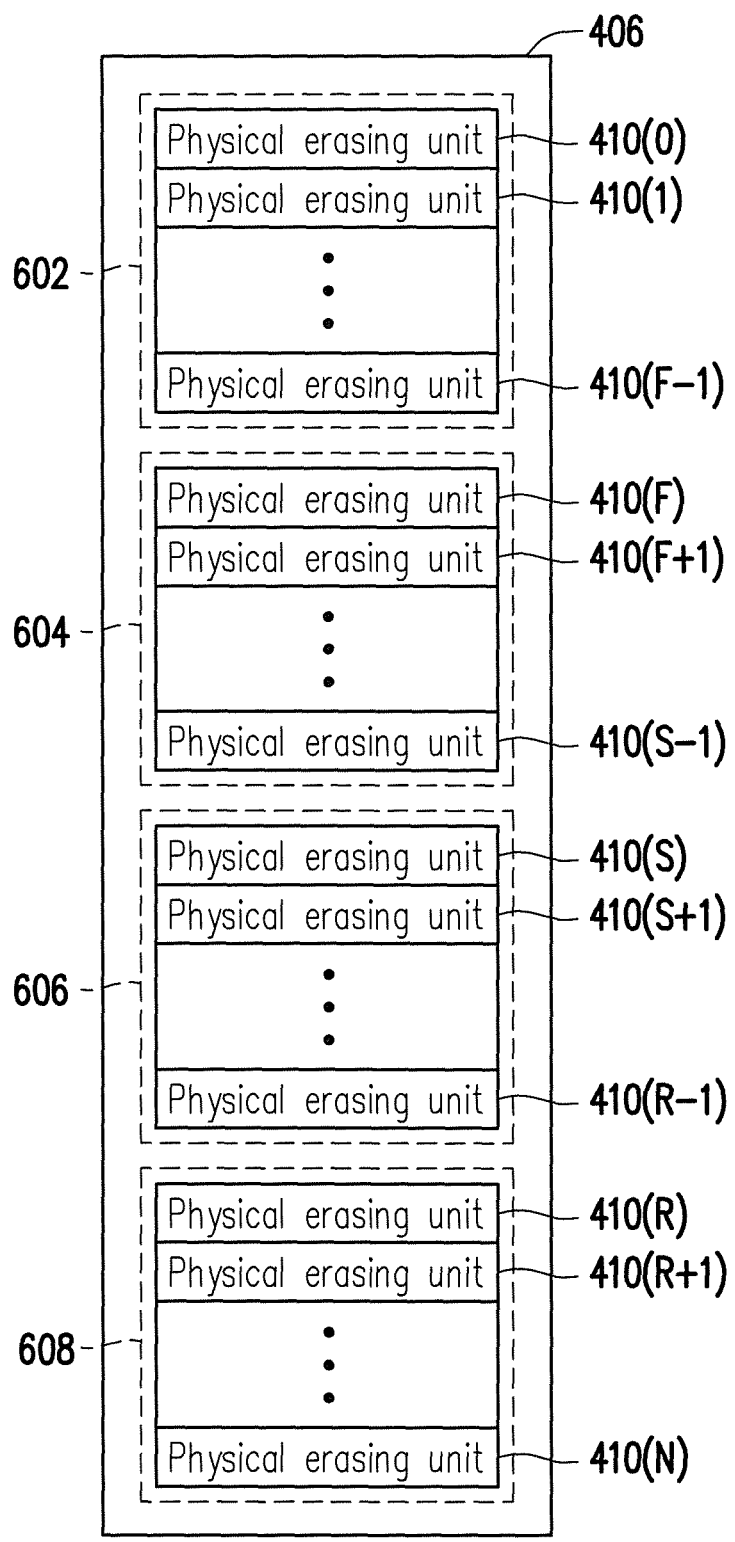
FIG. 6 and FIG. 7 are schematic diagrams illustrating management of a rewritable non-volatile memory module according to an exemplary embodiment of the invention.
Figure 7:
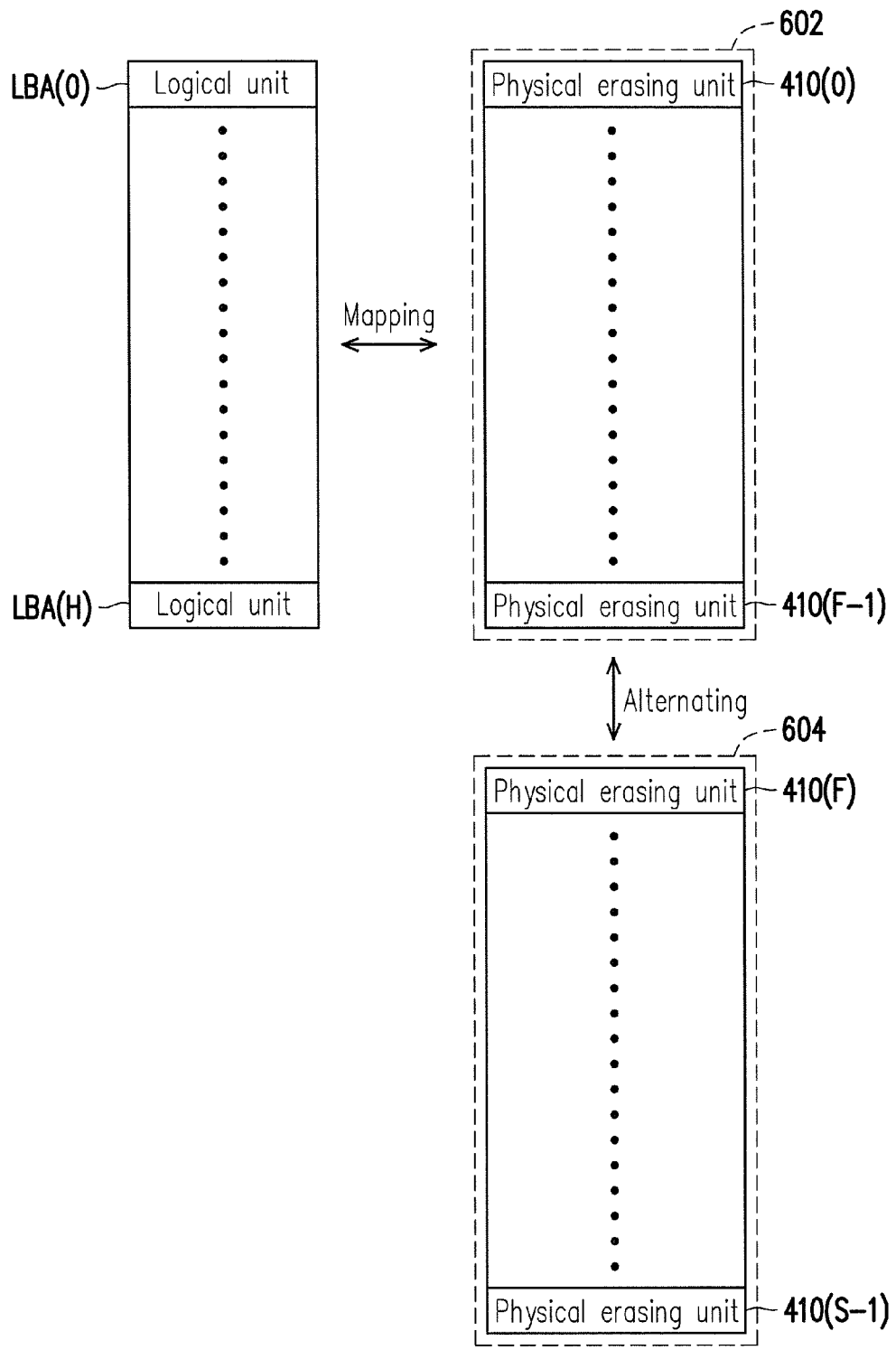

FIG. 6 and FIG. 7 are schematic diagrams illustrating management of a rewritable non-volatile memory module according to an exemplary embodiment of the invention.

It should be understood that the terms used herein for describing the operations (such as "select," "group," "divide," and "associate") performed on the rewritable non-volatile memory module 406 indicate logical operations. Namely, the physical erasing units in the rewritable non-volatile memory module are only logically operated, and the actual positions of the physical erasing units in the rewritable non-volatile memory module are not changed.

With reference to FIG. 6, the rewritable non-volatile memory module 406 includes a plurality of physical programming units, and the physical programming units constitute a plurality of physical erasing units 410(0)-400(N). According to the present exemplary embodiment, the physical programming unit is the smallest unit for programming; that is, each of the physical programming units is the smallest unit for writing data. The physical programming units are physical pages or physical sectors, for instance. In case that the physical programming units are the physical pages, each of the physical programming units usually includes a data bit region and a redundant bit region. The data bit region includes a plurality of physical sectors for storing data of users, and the redundant bit region is configured for storing system data (e.g., ECC codes). In the present exemplary embodiment, the data bit region contains 32 physical sectors, and the size of each physical sector is 512 bytes (512 B). However, in other exemplary embodiments, 4, 8, 16, or more or less number of the physical sectors may be contained in the data bit region, and the number and the size of the physical sectors are not limited in the invention. In another aspect, the physical erasing unit is the smallest unit for erasing data. Namely, each of the physical erasing units contains the least number of memory cells that are erased all together. The physical erasing units are physical blocks, for instance.

The memory management circuit 502 logically groups the physical erasing units 410(0)-410(N) into a data area 602, a spare area 604, a system area 606, and a replacement area 608.

The physical erasing units logically belonging to the data area 602 and the spare area 604 are configured for storing data from the host system 11. Particularly, the physical erasing units belonging to the data area 602 are already configured for storing data, and the physical erasing units belonging to the spare area 604 are configured for replacing the physical erasing units belonging to the data area 602. That is, when the writing commands and the data to be written are received from the host system 11, the memory management circuit 502 selects physical erasing units from the spare area 604 and writes the data into the selected physical erasing units for replacing the physical erasing units belonging to the data area 602. In an exemplary embodiment of the invention, the physical erasing units associated with the spare area 604 are referred as spare physical erasing units. In an exemplary embodiment of the invention, the physical erasing units storing valid data are referred as non-spare physical erasing units.

The physical erasing units logically belonging to the system area 606 are used for recording system data. For instance, the system data include the manufacturers and models of the rewritable non-volatile memory module, the number of the physical erasing units in the rewritable non-volatile memory module, the number of the physical programming units in each physical erasing unit, and so on.

The physical erasing units logically belonging to the replacement area 608 are physical erasing units that are applied in a defective physical erasing unit replacement procedure to replace damaged and defective physical erasing units. Particularly, if there are still normal physical erasing units in the replacement area 608, and the physical erasing unit in the data area 602 is damaged, the memory management circuit 502 selects a normal physical erasing unit from the replacement area 608 to replace the damaged physical erasing unit.

Note that the number of physical erasing units respectively belonging to the data area 602, the spare area 604, the system area 606, and the replacement area 608 may vary according to different memory specifications. Additionally, it has to be understood that the grouping relation of associating the physical erasing units with the data area 602, the spare area 604, the system area 606, and the replacement area 608 is dynamically changed during the operation of the memory storage device 10. For instance, when a physical erasing unit belonging to the spare area 604 is damaged and replaced by a physical erasing unit belonging to the replacement area 608, the physical erasing unit originally belonging to the replacement area 608 is associated with the spare area 604. Alternatively, after the physical erasing unit belonging to the spare area 604 is selected for writing data thereinto, the selected physical erasing unit is associated with the data area 602, and the logical unit corresponding to the selected physical erasing unit where the data being written is mapped to the selected physical erasing unit.

With reference to FIG. 7, the memory management circuit 502 configures logical units LBA(0)-LBA(H) for mapping the physical erasing units of the data area 602. The host system 11 accesses the data in the data area 602 through the logical units LBA(0)-LBA(H). Each of the logical units LBA(0)-LBA(H) may be constituted by one or more logical addresses. One logical unit may be mapped to one or more physical units. One physical unit may be one or more physical addresses, one or more physical sectors, one or more physical programming units, or one or more physical erasing units. The memory management circuit 202 establishes a logical-physical mapping table for recoding mapping relationships between the logical units and the physical units. For illustrative purposes, one physical erasing unit serving as one physical unit is provided below, and the data length of one logical unit is assumed to be equal to that of one physical unit.

If the host system 11 intends to write data into a logical unit or update data stored in the logical unit, the memory management circuit 502 selects one physical erasing unit from the spare area 604 and writes the data into the physical erasing unit. The memory management circuit 502 loads the logical-physical mapping table from the rewritable non-volatile memory module 406 to the buffer memory 508 and updates the mapping relationship between the logical unit and the physical erasing unit configured to store the data belonging to the logical unit to the logical-physical mapping table. The memory management circuit 502 can then find the corresponding physical erasing unit according to the logical-physical mapping table and can read data from the physical erasing unit.

In the present exemplary embodiment, the data length of one physical programming unit is 16×1024 k bytes (16 KB), and each physical erasing unit contains 16×1024 physical programming units. That is, the data length of one physical erasing unit is 256 megabytes (256 MB, wherein 1 MB=1 megabyte). However, in another exemplary embodiment, the data length of one physical programming unit and the number of the physical programming units of one physical erasing unit may be greater or less than those described above. Filling one physical programming unit or one physical erasing unit indicates that the data length of the stored data in the physical programming unit or the physical erasing unit is equal to the data length of the physical programming unit or the physical erasing unit, and the physical programming unit or the physical erasing unit can no longer store other data (e.g., data of users); by contrast, in case that one physical programming unit or one physical erasing unit is not completely filled, the data length of the stored data in the physical programming unit or the physical erasing unit is shorter than the data length of the physical programming unit or the physical erasing unit, and the physical programming unit or the physical erasing unit is still capable of storing other data. Similarly, filling one logical unit indicates that the logical unit can no longer store other data; in case that one logical unit is not completely filled, the logical unit is still capable of storing other data.

In an exemplary embodiment, if the memory management circuit 502 writes the data into one physical erasing unit selected from the spare area 604, the memory management circuit 502 determines whether the physical erasing unit is already or is about to be filled with data. If the physical erasing unit is already or is about to be filled, the memory management circuit 502 selects another physical erasing unit from the spare area 604. The selected physical erasing unit serves as a currently used physical erasing unit, and data are continuously written into the currently used physical erasing unit. The memory management circuit 502 may perform a data merging process or a garbage collection process on one or more physical erasing units where valid data are stored, so as to release one or more spare physical erasing units. For instance, the memory management circuit 502 writes the data belonging to one logical unit into a spare physical erasing unit selected from the spare area 604 and marks a portion of data in a non-spare physical erasing unit mapped to the logical unit in the data area 602 as invalid data. The memory management circuit 502 can copy the residual valid data in the non-spare physical erasing unit to the spare physical erasing unit and associate the non-spare physical erasing unit with the spare area 604. Thereby, one data merging process is completed. In the garbage collection process, the valid data stored in one or more non-spare physical programming units in the data area 602 are copied to one or more spare physical erasing units selected from the spare area 604, and the physical erasing unit in which the stored valid data are all copied is associated with the spare area 604. The physical erasing unit can be firstly erased and then associated with the spare area 604; alternatively, the physical erasing unit can be firstly associated with the spare area 604 and then erased. The time at which the erasing operation is performed is not limited herein.

The memory management circuit 502 receives a writing command (i.e., a first writing command) and the data corresponding to the first writing command from the host system 11. In response to the first writing command, the memory management circuit 502 allocates a plurality of logical units to store the data. Specifically, one or more first logical units of the logical units serve to store the first data of the data and are filled with the first data, and one or more second logical units of the logical units serve to store the second data of the data and are not filled with the second data. Besides, the memory management circuit 502 selects a plurality of physical erasing units from the spare area 604 and maps the logical units to the selected physical erasing units.

Figure 8:
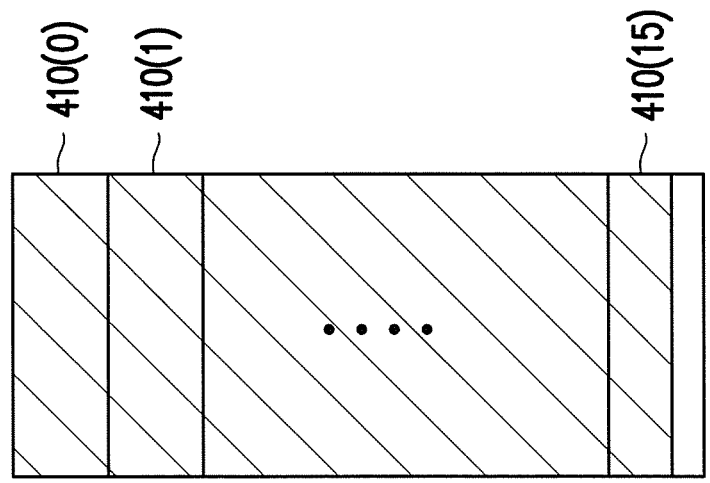
FIG. 8 to FIG. 10 are schematic diagrams illustrating a data writing operation according to an exemplary embodiment of the invention.
Figure 8:
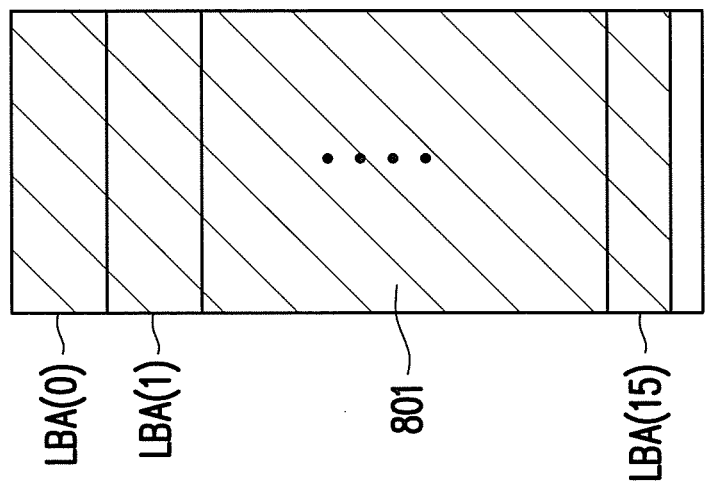
Figure 9:
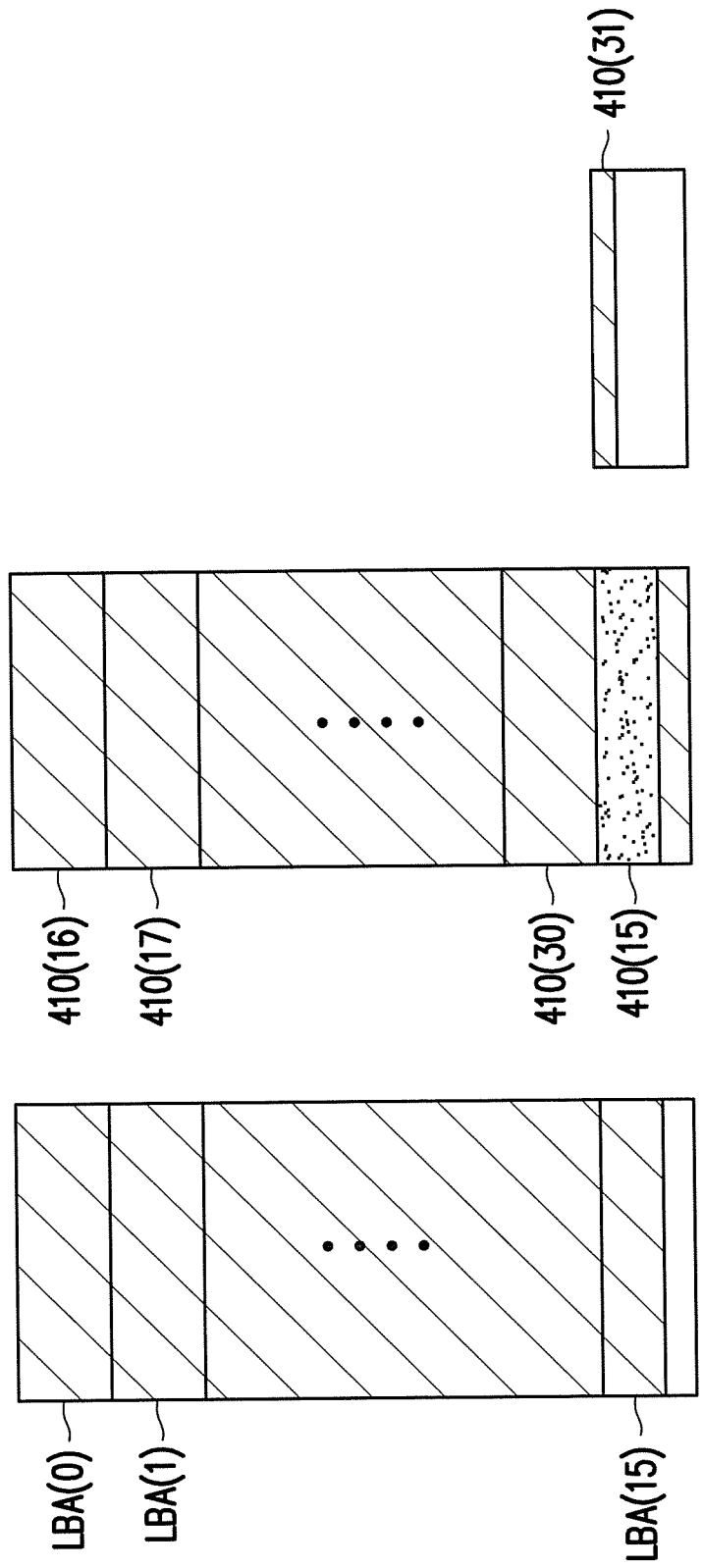
Figure 10:
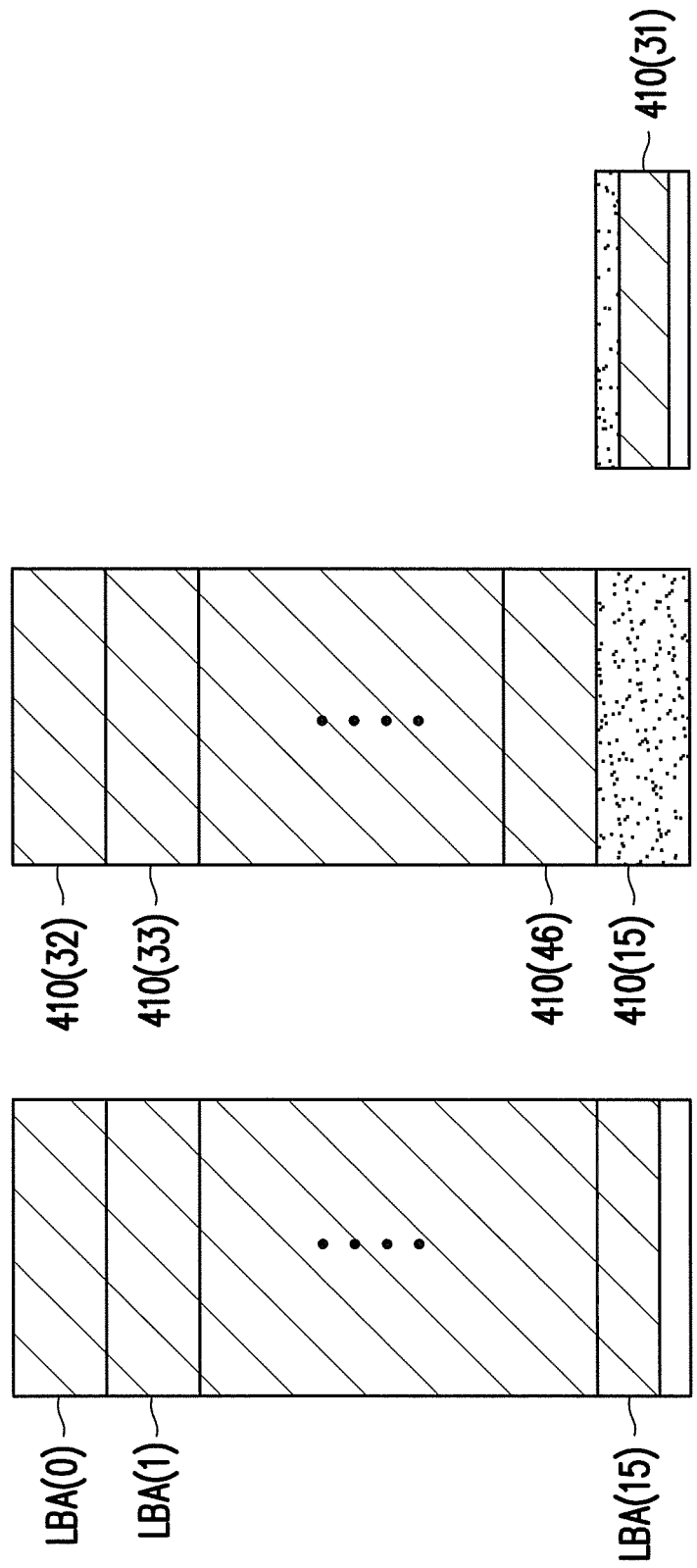

FIG. 8 to FIG. 10 are schematic diagrams illustrating a data writing operation according to an exemplary embodiment of the invention.

With reference to FIG. 8, the memory management circuit 502 receives a writing command (i.e., a first writing command) and the data 801 corresponding to the first writing command from the host system 11. Given that the data length of the data 801 is 4000 MB, the first writing command indicates to store the data 801 into 15.625 (4000/256=15.625) logical units, as shown in FIG. 8. Here, the areas where the data are written are marked by oblique lines. After the logical units LBA(0)-LBA(14) are filled with the data 801, a portion of the data 801 that is not written yet will be written into the logical unit LBA(15). According to the present exemplary embodiment, the logical units LBA(0)-LBA(14) filled with the data 801 are referred as the first logical units, and the logical unit LBA(15) not filled with the data 801 is referred as the second logical unit. The data stored in the logical units LBA(0)-LBA(14) are referred as the first data, and the data stored in the logical unit LBA(15) are referred as the second data. According to the present exemplary embodiment, the data length of the first data is 3840 (15×256=3840) MB, and the data length of the second data is 160 (0.625×256=160) MB. The data 801 are sequential data. That is, the logical units LBA(0)-LBA(15) serving to store the data 801 are arranged sequentially.

The memory management circuit 502 selects a plurality of physical erasing units from the spare area 604 and issues a writing command sequence (i.e., the first writing command sequence), so as to write the data 801 into the physical erasing units. The physical erasing units 410(0)-410(15) where the data 801 are written are associated with the data area 602. As shown in FIG. 8, after the physical erasing units 410(0)-410(14) are filled with the data 801, a portion of the data 801 that is not written yet will be written into the physical erasing unit 410(15). Here, the areas where the data are written are marked by oblique lines. According to the present exemplary embodiment, the physical erasing units 410(0)-410(14) filled with the data 801 are referred as the first physical erasing units, and the physical erasing unit 410(15) not filled with the data 801 is referred as the second physical erasing unit. The first data are stored in the physical erasing units 410(0)-410(14), and the second data are stored in the physical erasing unit 410(15). The memory management circuit 502 also maps the logical units LBA(0)-LBA(14) to the physical erasing units 410(0)-410(14) and maps the logical unit LBA(15) to the physical erasing unit 410(15). In another exemplary embodiment, if the data length of data to be written by the host system 11 varies, the number of logical units and the number of physical units for storing the data may be more than or less than those described herein.

In the present exemplary embodiment, the logical units LBA(0)-LBA(15) are sequentially arranged, and so are the physical erasing units 410(0)-410(15). That is, the data writing operation on the logical unit LBA(1) follows the data writing operation on the logical unit LBA(0), the data writing operation on the logical unit LBA(2) follows the data writing operation on the logical unit LBA(1), and the rest can be deduced therefrom. Similarly, the data writing operation on the physical erasing unit 410(1) follows the data writing operation on the physical erasing unit 410(0), the data writing operation on the physical erasing unit 410(2) follows the data writing operation on the physical erasing unit 410(1), and the rest can be deduced from the above. In another exemplary embodiment, however, the logical units LBA(0)-LBA(15) may not be sequentially arranged; alternatively, the physical erasing units 410(0)-410(15) may not be sequentially arranged.

After receiving the first writing command, the memory management circuit 502 receives another writing command (i.e., a second writing command) and the data corresponding to the second writing command from the host system 11. Here, the data corresponding to the second writing command is assumed to be the same as the data corresponding to the first writing command, and the second writing command indicates to write the first data of the data into the first logical unit and writing the second data of the data into the second logical unit. The logical address required by the second writing command is the same as that required by the first writing command. In response to the second writing command, the memory management circuit 502 selects one or more physical erasing units (i.e., the third physical erasing unit) from the spare area 604 to store the first data and determines whether a remaining space in the second physical erasing unit is smaller than a threshold. If the remaining space in the second physical erasing unit is smaller than the threshold, the memory management circuit 502 selects one or more physical erasing units (i.e., the fourth physical erasing unit) from the spare area 604 and issue a writing command sequence (i.e., a second writing command sequence) to the rewritable non-volatile memory module 406. Here, the second writing command sequence indicates to write the first data into the third physical erasing unit and indicates to write the second data into the second physical erasing unit and the fourth physical erasing unit. In the present exemplary embodiment, the threshold may be set by manufacturers, may be equal to the data length of the second data stored in each second logical unit, may be equal to the data length of the second data stored in one of the second logical units, or may be equal to a total length of the second data stored in the second logical units.

With reference to FIG. 9, if the second writing command indicates to store data into the logical units LBA(0)-LBA(15), the memory management circuit 502 may, in response to the second writing command, select the physical erasing units 410(16)-410(30) from the spare area 604 and determine whether a remaining space in the physical erasing unit 410(15) (that is not filled yet) is smaller than a threshold. The threshold is, for instance, equal to the data length of the second data stored in the logical unit LBA(15). In the present exemplary embodiment, the remaining space in the physical erasing unit 410(15) is smaller than the threshold, which indicates that the physical erasing unit 410(15) is about to be filled and cannot store the complete second data. The memory management circuit 502 thus selects the physical erasing unit 410(31) from the spare area 604. The memory management circuit 502 issues the second writing command sequence to the rewritable non-volatile memory module 406. Here, the second writing command sequence indicates to write the first data stored in the logical units LBA(0)-LBA(14) into the physical erasing units 410(16)-410(30) and indicates to write the second data stored in the logical unit LBA(15) into the physical erasing unit 410(15) and the physical erasing unit 410(31). The physical erasing units 410(16)-410(30) are filled with the first data, and the remaining space in the physical erasing unit 410(15) is firstly filled with the second data. The residual portion of the second data which cannot be written into the physical erasing unit 410(15) will be written into the physical erasing unit 410(31), as shown in FIG. 9 (wherein the areas where the data are written are marked by oblique lines). Before, during, or after the data writing operation corresponding to the second writing command, the memory management circuit 502 also maps the logical units LBA(0)-LBA(14) to the physical erasing units 410(16)-410(30) and maps the logical unit LBA(15) to the physical erasing unit 410(15) and the physical erasing unit 410(31). At this time, the physical erasing unit 410(15) and the physical erasing unit 410(31) are in the so-called open-mother-son-block state.

If the remaining space in the second physical erasing unit is not smaller than the threshold, the memory management circuit 502 writes the second data into the second physical erasing unit, and the selection of the fourth physical erasing unit can be omitted. For instance, in another exemplary embodiment of FIG. 9, if the remaining space in the physical erasing unit 410(15) is greater than the data length of the second data stored in the logical unit LBA(15), the memory management circuit 502 issues a writing command sequence to the rewritable non-volatile memory module 406. Here, the writing command sequence indicates to write the first data stored in the logical units LBA(0)-LBA(14) into the physical erasing units 410(16)-410(30) and indicates to write the second data stored in the logical unit LBA(15) into the physical erasing unit 410(15). Additionally, the memory management circuit 502 maps the logical units LBA(0)-LBA(14) to the physical erasing units 410(16)-410(30).

With reference to FIG. 10, after receiving the second writing command, the memory management circuit 502 may further receive another writing command (i.e., the third writing command), and the third writing command also indicates to write the first data of the data into the logical units LBA (0)-LBA(14) and writing the second data of the data into the logical unit LBA(15). The logical address required by the third writing command is the same as that required by the first writing command. In response to the third writing command, the memory management circuit 502 selects the physical erasing units 410(32)-410(46) from the spare area 604 and determines whether a remaining space in the physical erasing unit 410(31) is smaller than a threshold. The threshold is, for instance, equal to the length of the second data stored in the logical unit LBA(15). In the present exemplary embodiment, the remaining space in the physical erasing unit 410(31) is greater than the threshold; hence, the memory management circuit 502 issues a writing command sequence to write the first data stored in the logical units LBA(0)-LBA(14) into the physical erasing units 410(32)-410(46) and write the second data stored in the logical unit LBA(15) into the remaining space in the physical erasing unit 410(31), as shown in FIG. 10 (wherein the areas where the data are written are marked by oblique lines). Besides, the memory management circuit 502 maps the logical units LBA(0)-LBA(14) to the physical erasing units 410(32)-410(46) and maps the logical unit LBA (15) to the physical erasing unit 410(31). Specifically, in each of said data writing processes, the memory management circuit 502 does not perform the data merging process for releasing physical erasing units even though the remaining space in certain physical erasing units is insufficient, and therefore the data writing speed is not reduced.

According to an exemplary embodiment of the invention, the number of the second logical unit is greater than 1, and so is the number of the second physical erasing unit. Besides, the number of the first logical unit and the number of the first physical erasing unit may be greater or less than those described herein. If the number of the second logical unit is greater than 1, and the number of the second physical erasing unit is greater than 1 as well, each second logical unit stores a portion of the second data and is mapped to one of the second physical erasing units. In the following embodiment, the number of the second logical unit is 2, and the number of the second physical erasing unit is 2 as well; however, the number of the second logical unit and the number of the second physical erasing unit may be greater than those described herein.

If the number of the second logical unit is greater than 1, and the number of the second physical erasing unit is greater than 1 as well, the memory management circuit 502 may, in response to the second writing command, determine whether the remaining space in each second physical erasing unit is smaller than the threshold respectively corresponding to the second physical erasing units. If the remaining space in at least one of the second physical erasing unit is smaller than the threshold corresponding to the at least one of the second physical erasing unit, the memory management circuit 502 selects the fourth physical erasing unit from the spare area 604 and issue the second writing command sequence to the rewritable non-volatile memory module 406. The threshold corresponding to each second physical erasing unit is, for instance, equal to the data length of the second data stored in each second logical unit. The data length of the second data stored in each of the second physical erasing units may be the same or different from each other, and thus the threshold corresponding to each of the second physical erasing units may be the same or different from each other. If the remaining space in each of the second physical erasing units is not smaller than the threshold respectively corresponding to the second physical erasing units, the memory management circuit 502 issues the first writing command sequence to the rewritable non-volatile memory module 406.

Figure 11:
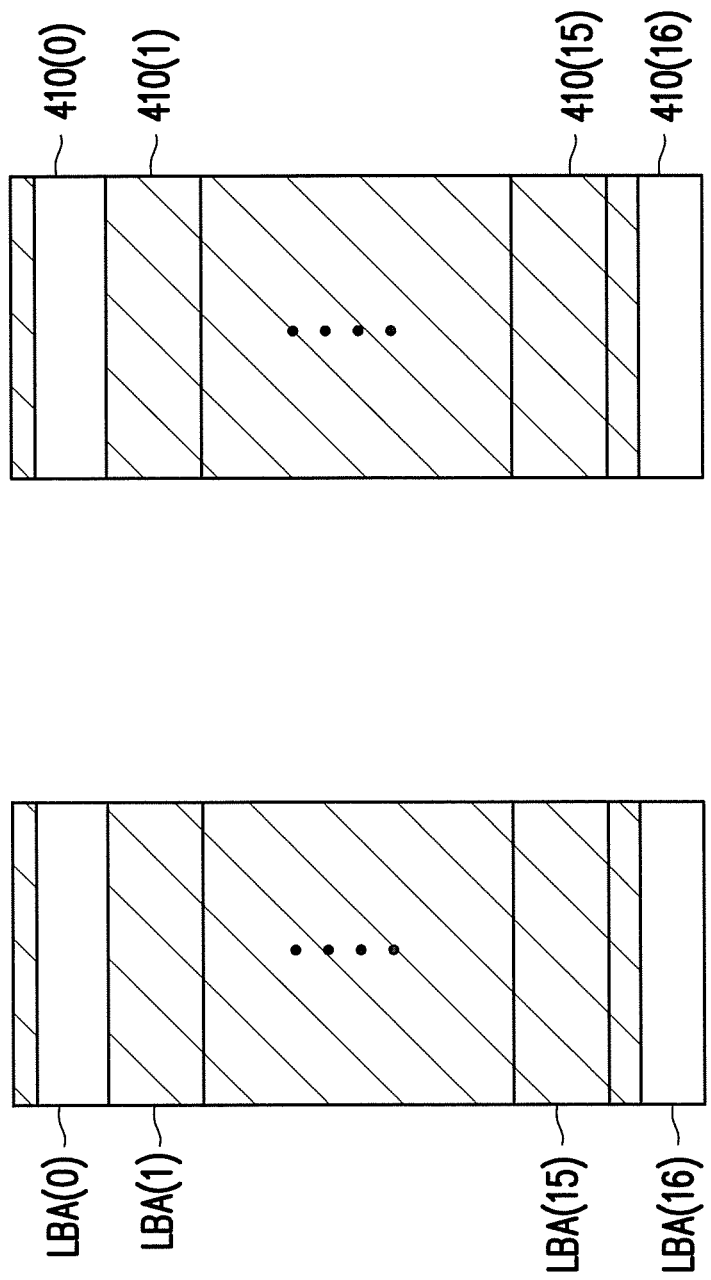
FIG. 11 to FIG. 13 are schematic diagrams illustrating a data writing operation according to another exemplary embodiment of the invention.
Figure 12:
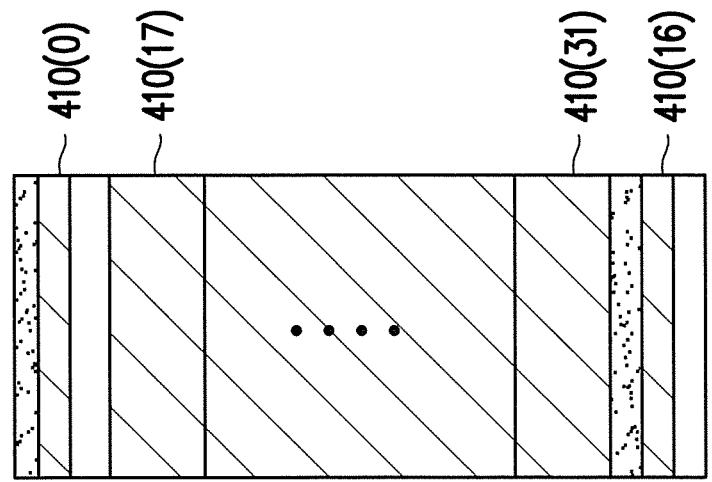
Figure 12:
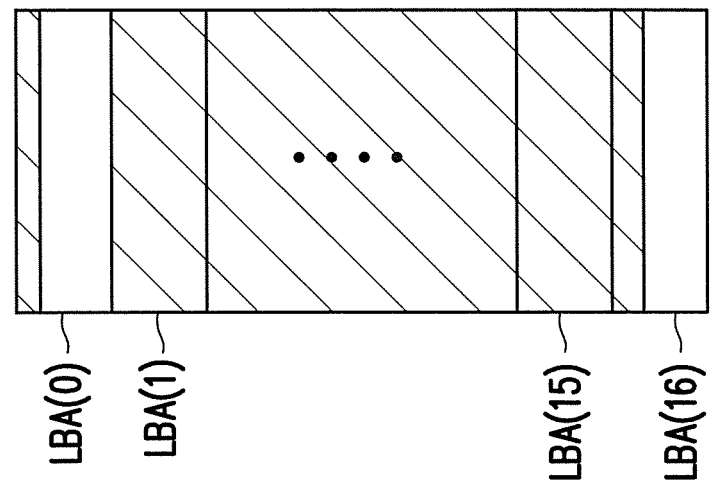
Figure 13:
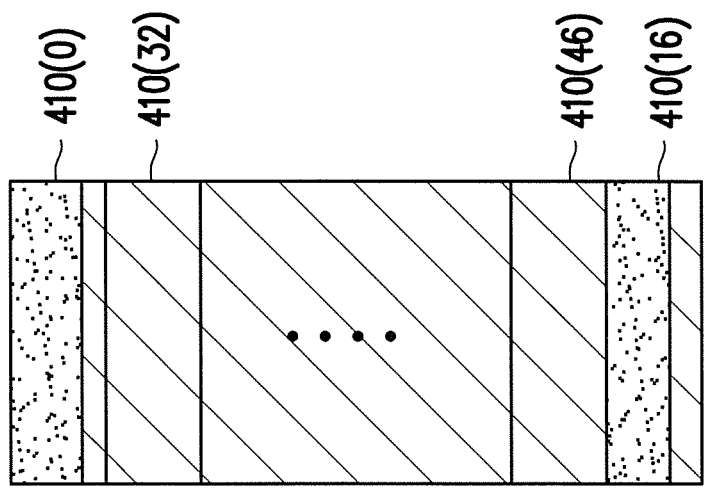
Figure 13:
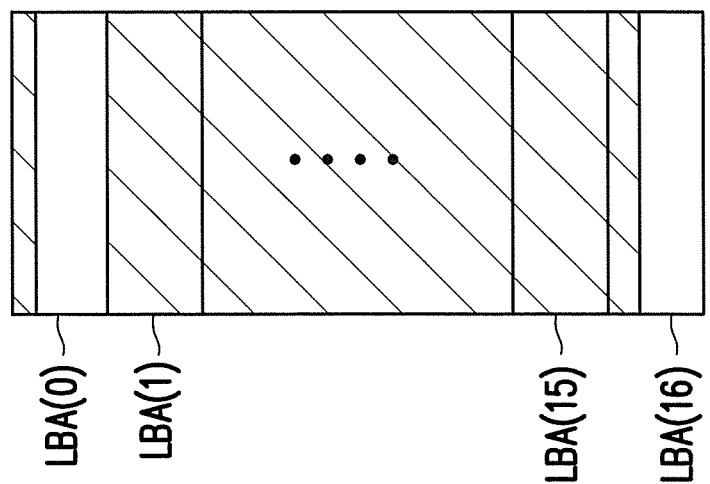

FIG. 11 to FIG. 13 are schematic diagrams illustrating a data writing operation according to another exemplary embodiment of the invention.

With reference to FIG. 11, in the present exemplary embodiment, the first writing command from the host system 11 indicates to store the data into the logical units LBA(0)-LBA(16). Here, the logical units LBA(1)-LBA(15) serve to store the first data of the data, the logical units LBA(0) and LBA(16) respectively serve to store a portion of the second data, and the logical units LBA(0)-LBA(16) are sequentially arranged. For instance, the logical unit LBA(1) follows the logical unit LBA(0), and the logical unit LBA(16) follows the logical unit LBA(15). The data lengths of the second data stored in the logical units LBA(0) and LBA(16) may be the same or different from each other. In response to the first writing command, the memory management circuit 502 selects the physical erasing units 410(0)-410(16) from the spare area 604. The physical erasing units 410(0)-410(16) are sequentially arranged. For instance, the physical erasing unit 410(1) follows the physical erasing unit 410(0), and the physical erasing unit 410(16) follows the physical erasing unit 410(15). The memory management circuit 502 writes the first data into the physical erasing units 410(1)-410(15) and writes the second data into the physical erasing units 410(0) and 410(16), as shown in FIG. 11 (wherein the areas where the data are written are marked by oblique lines). Here, the physical erasing units 410(1)-410(15) are filled with the first data. Given that the logical units LBA(0) and LBA(16) individually store half the second data, the physical erasing units 410(0) and 410(16) respectively store half the second data. For instance, the second data stored in the physical erasing unit 410(0) account for 0.3125 (0.625/2=0.3125) physical erasing unit, and the second data stored in the physical erasing unit 410(16) account for 0.3125 physical erasing unit as well. Additionally, the memory management circuit 502 maps the logical units LBA(0), LBA(1)-LBA(15), and LBA(16) to the physical erasing units 410(0), 410(1)-LBA(15), and 410(16), respectively.

With reference to FIG. 12, after receiving the first writing command, the second writing command from the host system 11 indicates to store the data into the logical units LBA(0)-LBA(16). Here, the logical units LBA(1)-LBA(15) serve to store the first data of the data, and the logical units LBA(0) and LBA(16) respectively serve to store the second data. In response to the second writing command, the memory management circuit 502 selects the physical erasing units 410(17)-410(31) from the spare area 604 and determines whether a remaining space in each of the physical erasing units 410(0) and 410(16) is smaller than a threshold. For instance, if the data length of the second data stored in the logical unit LBA (0) is the same as the data length of the second data stored in the logical unit LBA(16), the threshold is equal to the data length of the second data respectively stored in the logical units LBA(0) and LBA(16). Alternatively, if the data length of the second data stored in the logical unit LBA(0) is different from the data length of the second data stored in the logical unit LBA(16), the threshold corresponding to the physical erasing unit 410(0) is equal to the data length of the second data stored in the logical unit LBA(0), and the threshold corresponding to the physical erasing unit 410(16) is equal to the data length of the second data stored in the logical unit LBA(16).

In the present exemplary embodiment, the remaining space in each of the physical erasing units 410(0) and 410(16) is greater than the corresponding threshold; hence, the memory management circuit 502 issues a writing command sequence to the rewritable non-volatile memory module 406 to write the first data into the physical erasing units 410(17)-410(31) and write the second data into the physical erasing units 410(0) and 410(16), as shown in FIG. 12 (wherein the areas where the data are written are marked by oblique lines). In addition, the memory management circuit 502 maps the logical units LBA(1)-LBA(15) to the physical erasing units 410 (17)-410(31).

With reference to FIG. 13, after receiving the second writing command, the third writing command from the host system 11 indicates to store the data into the logical units LBA (0)-LBA(16). Here, the logical units LBA(1)-LBA(15) serve to store the first data of the data, and the logical units LBA(0) and LBA(16) respectively serve to store the second data. In response to the third writing command, the memory management circuit 502 selects the physical erasing units 410(32)- 410(46) from the spare area 604 and determines whether a remaining space in each of the physical erasing units 410(0) and 410(16) is smaller than a threshold. The threshold corresponding to the physical erasing unit 410(0) may be the same as or different from threshold corresponding to the physical erasing unit 410(16), which will not be further elaborated hereinafter. In the present exemplary embodiment, although the physical erasing units 410(0) and 410(16) respectively twice store the second data stored in the logical units LBA(0) and LBA(16), the respective remaining space in each of the physical erasing units 410(0) and 410(16) is still greater than the corresponding threshold; hence, the memory management circuit 502 issues a writing command sequence to the rewritable non-volatile memory module 406 to write the first data into the physical erasing units 410(32)-410(i46) and write the second data into the physical erasing units 410(0) and 410(16), as shown in FIG. 13 (wherein the areas where the data are written are marked by oblique lines). In addition, the memory management circuit 502 maps the logical units LBA(1)-LBA(15) to the physical erasing units 410(32)-410 (46).

In another exemplary embodiment of FIG. 12, if the data length of the second data stored in the logical unit LBA(0) is different from the data length of the second data stored in the logical unit LBA(16), the remaining space of one of the physical erasing units 410(0) and 410(16) may be smaller than the corresponding threshold. Accordingly, if the second data respectively stored in the logical units LBA(0) and LBA (16) needs to be further stored, another one or more physical erasing units (i.e., one or more fifth physical erasing units) may have to be selected to assist at least one of the physical erasing units 410(0) and 410(16) in storing data.

Figure 14:
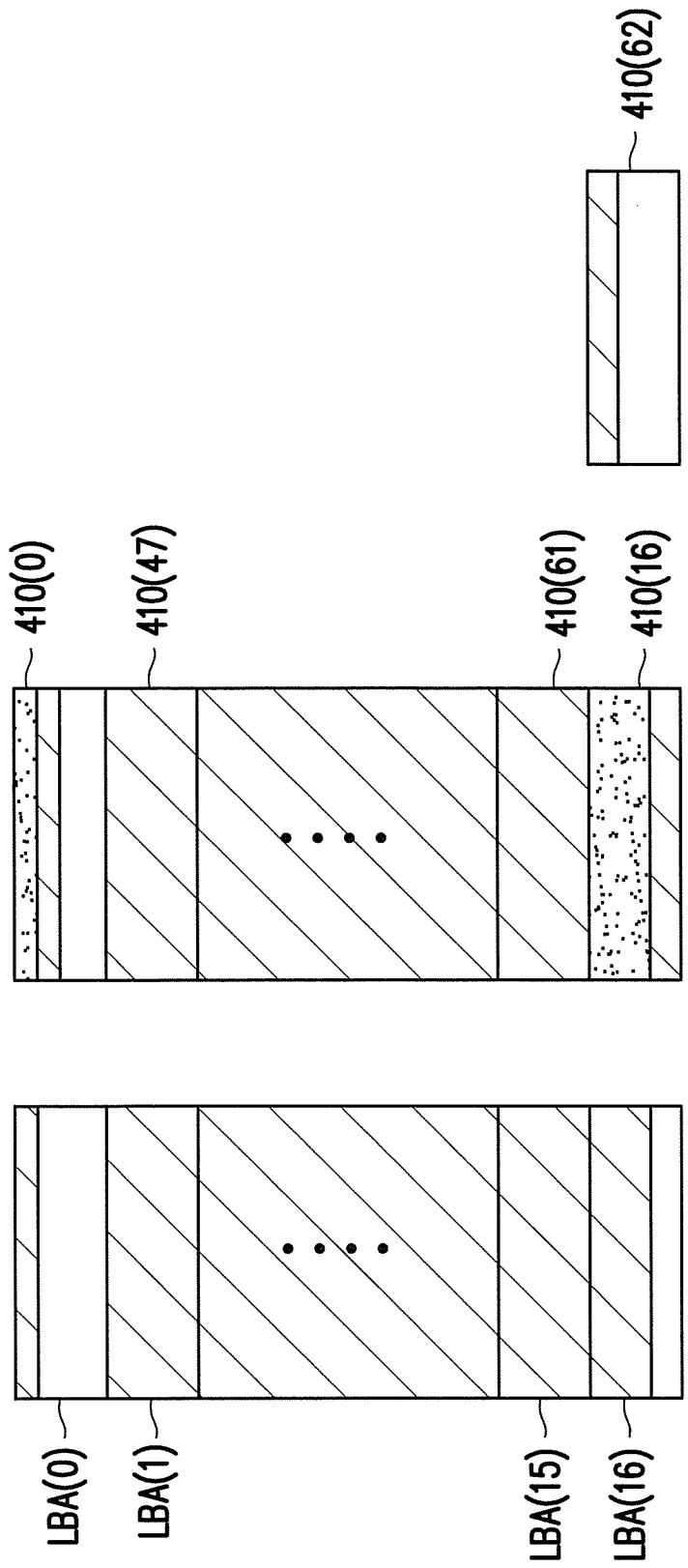
FIG. 14 is a schematic diagram illustrating a data writing operation according to another exemplary embodiment of the invention.

FIG. 14 is a schematic diagram illustrating a data writing operation according to another exemplary embodiment of the invention.

With reference to FIG. 14, if the data length of the second data stored in the logical unit LBA(0) is different from the data length of the second data stored in the logical unit LBA (16), e.g., as shown in FIG. 14, the data length of the second data stored in the logical unit LBA(0) is smaller than the data length of the second data stored in the logical unit LBA(16), the memory management circuit 502 may receive a writing command from the host system 11, and the writing command indicates to store the data into the logical units LBA(0)-LBA (16). Here, the logical units LBA(1)-LBA(15) serve to store the first data of the data, and the logical units LBA(0) and LBA(16) respectively serve to store the second data. In response to the writing command, the memory management circuit 502 selects the physical erasing units 410(47)-410(61) from the spare area 604. The memory management circuit 502 determines whether the remaining space in the physical erasing unit 410(0) is smaller than the threshold corresponding to the physical erasing unit 410(0) and whether the remaining space in the physical erasing unit 410(16) is smaller than the threshold corresponding to the physical erasing unit 410(16). Here, the threshold corresponding to the physical erasing unit 410(0) is equal to the data length of the second data stored in the logical unit LBA(0), and the threshold corresponding to the physical erasing unit 410(16) is equal to the data length of the second data stored in the logical unit LBA(16).

As shown in FIG. 14, if the remaining space in the physical erasing unit 410(16) is smaller than the threshold corresponding to the physical erasing unit 410(16), and the remaining space in the physical erasing unit 410(0) is not smaller than the threshold corresponding to the physical erasing unit 410 (0), the memory management circuit 502 selects the physical erasing unit 410(62) from the spare area 604. The memory management circuit 502 issues a writing command sequence (i.e., the fourth writing command sequence) which indicates to write the first data into the physical erasing units 410(47)- 410(61), indicates to write the second data stored in the logical unit LBA(0) into the physical erasing unit 410(0), and indicates to write the second data stored in the logical unit LBA(16) into the physical erasing unit 410(16) and the physical erasing unit 410(62), as shown in FIG. 14 (wherein the areas where the data is stored are marked by oblique lines). Besides, the memory management circuit 502 maps the logical unit LBA(0) to the physical erasing unit 410(0), maps the logical units LBA(1)-LBA(15) to the physical erasing units 410(47)-410(61), and maps the logical unit LBA(16) to the physical erasing units 410(16) and 410(62). That is, in the present exemplary embodiment, the physical erasing unit 410(62) serves to assist in storing a portion of the second data stored in the logical unit LBA(16), and said portion of the second data cannot be stored in the physical erasing unit 410(16).

However, in another exemplary embodiment, if the remaining space in the physical erasing unit 410(0) is smaller than the threshold corresponding to the physical erasing unit 410(0) and the remaining space in the physical erasing unit 410(16) is not smaller than the threshold corresponding to the physical erasing unit 410(16), and if the second data respectively stored in the logical units LBA(0) and LBA(16) is required to be stored again, the memory management circuit 502 indicates to write the second data stored in the logical unit LBA(16) into the physical erasing unit 410(16) and write the second data stored in the logical unit LBA(0) into the physical erasing unit 410(0) and the physical erasing unit 410(62). That is, in this exemplary embodiment, the physical erasing unit 410(62) serves to assist in storing a portion of the second data stored in the logical unit LBA(0), and said portion of the second data cannot be stored in the physical erasing unit 410(0).

Alternatively, in another exemplary embodiment, if the remaining space in the physical erasing unit 410(0) is smaller than the threshold corresponding to the physical erasing unit 410(0) and the remaining space in the physical erasing unit 410(16) is smaller than the threshold corresponding to the physical erasing unit 410(16) as well, and if the second data respectively stored in the logical units LBA(0) and LBA(16) is required to be stored again, the memory management circuit 502 selects at least two or more other physical erasing units (i.e., fifth physical erasing units) to assist in storing the second data respectively stored in the logical units LBA(0) and LBA(16). How the fifth physical erasing units assist in storing the second data respectively stored in the logical units LBA(0) and LBA(16) is already elaborated above and thus will not be further explained hereinafter.

In the exemplary embodiments respectively shown in FIG. 8 to FIG. 10 and FIG. 11 to FIG. 13, if the data length of test data for testing the data writing speed is 4000 MB and the capacity of each physical erasing unit is 256 MB, neither the data merging process nor the garbage collection process may be performed during at least the first three data writing processes. Thereby, the speed of writing the test data into the rewritable non-volatile memory module 406 is not reduced. Moreover, if those described in said embodiments are collectively applied, neither the data merging process nor the garbage collection process is performed during at least the first six data writing processes.

Figure 15:
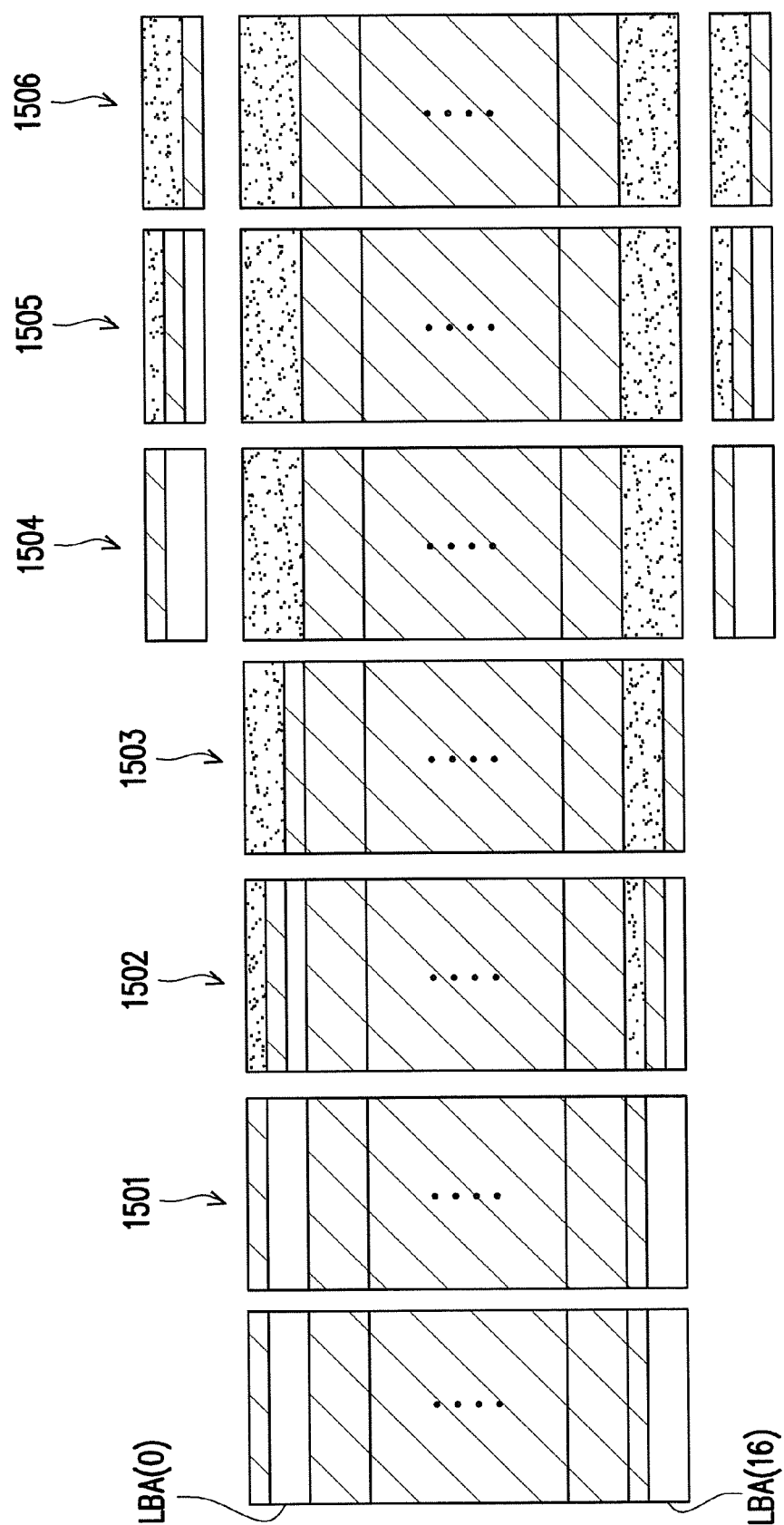
FIG. 15 is a schematic diagram illustrating a data writing operation according to another exemplary embodiment of the invention.

FIG. 15 is a schematic diagram illustrating a data writing operation according to another exemplary embodiment of the invention.

With reference to FIG. 15, given that one or more writing commands indicate to repeatedly perform at least N data writing processes on the logical units LBA(0)-LBA(15), plural physical erasing units may be selected from the spare area 406 to store the data in each of the N data writing processes. N may be any positive integer. Since each data writing process is already described above, no further explanation is provided hereinafter. Taking the first six data writing processes 1501-1506 as an example, in the first three data writing processes 1501-1503, the data (i.e., the second data) stored in the logical units LBA(0) and LBA(16) are repeatedly written into the first and last physical erasing units in the selected physical erasing unit series; in the last three data writing processes 1504-1506, the data (i.e., the second data) stored in the logical units LBA(0) and LBA(16) are repeatedly written into another two selected physical erasing units. Thereby, neither the data merging process nor the garbage collection process is performed during at least the first six data writing processes, and reduction of the data writing speed can be prevented.

In said exemplary embodiments, the physical erasing units that serve to store the first data are filled with the corresponding first data in each data writing process; hence, the data writing operations performed on the physical erasing units that serve to store the first data are sequentially writing operations. By contrast, the physical erasing units that serve to store the second data are not necessarily filled with the corresponding second data; hence, the data writing operations performed on the physical erasing units that serve to store the second data are randomly writing operations. For instance, in the exemplary embodiment shown in FIG. 8, the data writing operations performed on the physical erasing units 410(0)-410(14) are the sequentially writing operations, and the data writing operation performed on the physical erasing unit 410(15) is the randomly writing operation. In the exemplary embodiment shown in FIG. 9, the data writing operations performed on the physical erasing units 410(16)-410(30) are the sequentially writing operations, and the data writing operations performed on the physical erasing units 410(15) and 410(31) are the randomly writing operations. Besides, in an exemplary embodiment of the invention, the physical erasing units on which the sequentially writing operations are performed are referred as sequential physical erasing units, and the physical erasing units on which the randomly writing operations are performed are referred as random physical erasing units.

According to an exemplary embodiment of the invention, the logical units required by each data writing command may be set through revising the file allocation table (FAT) of the host system 11. Alternatively, the memory management circuit 502 in another exemplary embodiment may adjust the way to use the logical units in each data writing command as well as the mapping relationship between the logical units and the physical units through revising the logical-physical mapping table. Hence, in an exemplary embodiment of the invention, as long as the memory space (e.g., the physical erasing units) required by each data writing process may be determined in advance, the step of determining whether the remaining space in the physical erasing units is smaller than the corresponding threshold can be omitted. For instance, in an exemplary embodiment as shown in FIG. 15, at least the first six data writing operations may be defined as a predetermined data writing mechanism, and the predetermined operation (e.g., the step of selecting one or more physical erasing units from the spare area 604 and writing data thereinto) is performed in each data writing process under such mechanism. As such, the data writing operation can be further accelerated, and the amount of computation by the system can be reduced.

Figure 16:
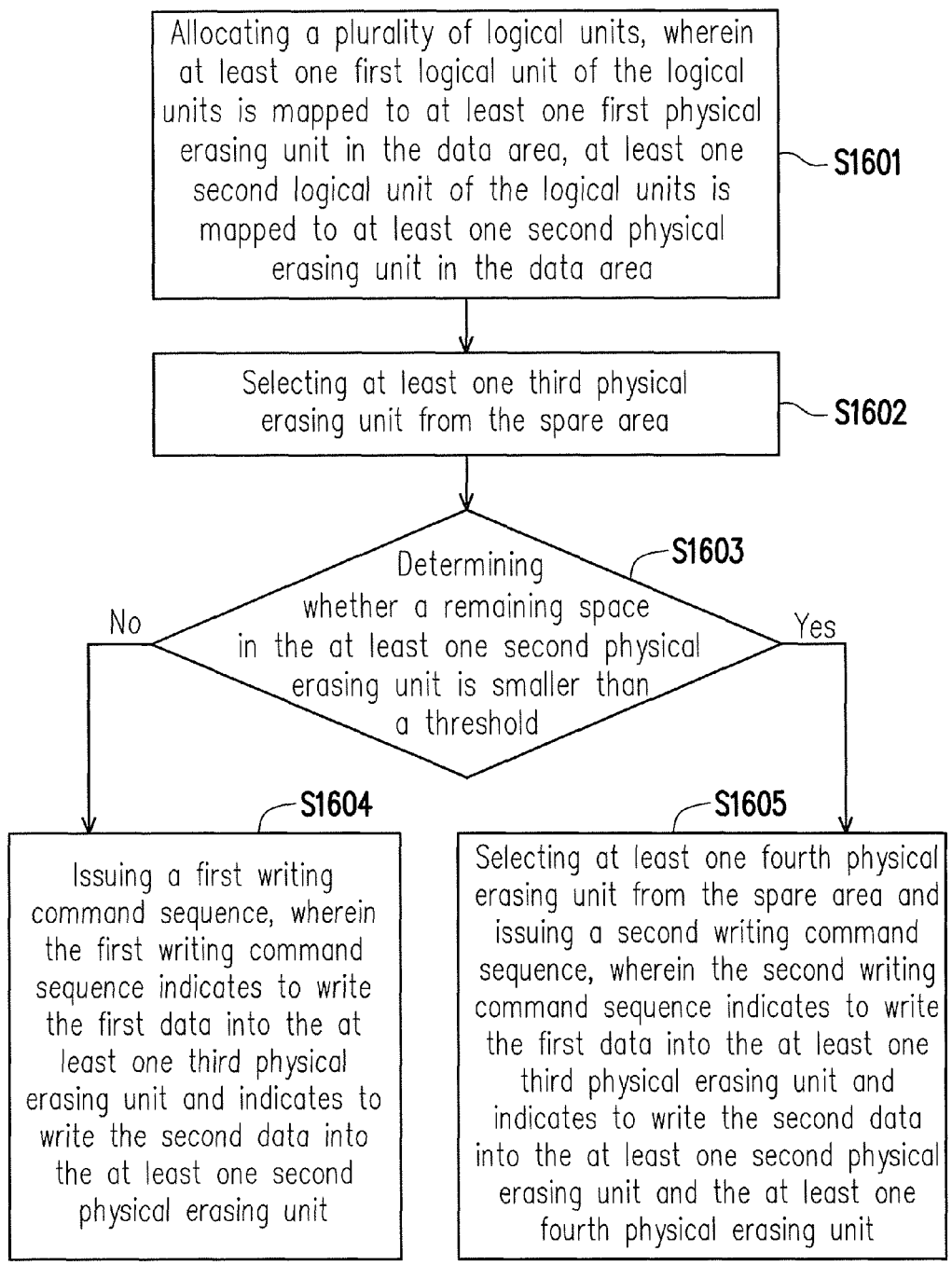
FIG. 16 is a flowchart illustrating a data writing method according to an exemplary embodiment of the invention.

FIG. 16 is a flowchart illustrating a data writing method according to an exemplary embodiment of the invention.

With reference to FIG. 16, in step S1601, plural logical units are allocated, wherein at least one first logical unit of the logical units is mapped to at least one first physical erasing unit of the physical erasing units in the data area, at least one second logical unit of the logical units is mapped to at least one second physical erasing unit of the physical erasing units in the data area, the at least one first physical erasing unit stores first data and is filled with the first data, and the at least one second physical erasing unit stores second data and is not filled with the second data. In step S1602, at least one third physical erasing unit is selected from the spare area. In step S1603, whether a remaining space in the at least one second physical erasing unit is smaller than a threshold is determined. If the remaining space in the at least one second physical erasing unit is not smaller than the threshold, in step S1604, a first writing command sequence is issued, wherein the first writing command sequence indicates to write the first data into the at least one third physical erasing unit and indicates to write the second data into the at least one second physical erasing unit. If the remaining space in the at least one second physical erasing unit is smaller than the threshold, in step S1605, at least one fourth physical erasing unit is selected from the spare area, and a second writing command sequence is issued, wherein the second writing command sequence indicates to write the first data into the at least one third physical erasing unit and indicates to write the second data into the at least one second physical erasing unit and the at least one fourth physical erasing unit.

To sum up, the number of the random physical erasing units can be managed, and the random physical erasing units may serve to store the random data in multiple randomly writing operations following with multiple sequentially writing operations. Moreover, through the management of the logical-physical mapping table, no data merging process need be performed during multiple sequentially writing operations, and the data writing efficiency can be further enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data writing method for controlling a rewritable non-volatile memory module, wherein the rewritable non-volatile memory module comprises a plurality of physical erasing units, the physical erasing units are at least grouped into a data area and a spare area, and the data writing method comprises:

allocating a plurality of logical units, wherein at least one first logical unit of the logical units is mapped to at least one first physical erasing unit of the physical erasing units in the data area, at least one second logical unit of the logical units is mapped to at least one second physical erasing unit of the physical erasing units in the data area, the at least one first physical erasing unit stores first data and is filled with the first data, and the at least one second physical erasing unit stores second data and is not filled with the second data;

selecting at least one third physical erasing unit of the physical erasing units from the spare area and determining whether a remaining space in the at least one second physical erasing unit is smaller than a threshold;

if the remaining space in the at least one second physical erasing unit is not smaller than the threshold, issuing a first writing command sequence, wherein the first writing command sequence indicates to write the first data into the at least one third physical erasing unit and indicates to write the second data into the at least one second physical erasing unit; and if the remaining space in the at least one second physical erasing unit is smaller than the threshold, selecting at least one fourth physical erasing unit of the physical erasing units from the spare area and issuing a second writing command sequence, wherein the second writing command sequence indicates to write the first data into the at least one third physical erasing unit and indicates to write the second data into the at least one second physical erasing unit and the at least one fourth physical erasing unit.

2. The data writing method according to claim 1, wherein the threshold is equal to a data length of the second data stored in the at least one second logical unit.

3. The data writing method according to claim 1, further comprising:

receiving a first writing command from a host system, wherein the first writing command indicates to write the first data into the at least one first logical unit and indicates to write the second data into the at least one second logical unit; and after receiving the first writing command, receiving a second writing command from the host system, wherein the second writing command indicates to write the first data into the at least one first logical unit and indicates to write the second data into the at least one second logical unit, wherein the step of selecting the at least one third physical erasing unit from the spare area and determining whether the remaining space in the at least one second physical erasing unit is smaller than the threshold is performed in response to the second writing command.

4. The data writing method according to claim 1, wherein a first data writing operation on the at least one first physical erasing unit and the at least one third physical erasing unit is a sequentially writing operation, and a second data writing operation on the at least one second physical erasing unit and the at least fourth physical erasing unit is a randomly writing operation.

5. The data writing method according to claim 1, wherein the number of the at least one second logical unit is greater than 1, the number of the at least one second physical erasing unit is greater than 1, and the data writing method further comprises:

mapping each of the at least one second logical unit to one of the at least one second physical erasing unit, wherein each of the at least one second physical erasing unit stores a portion of the second data.

6. The data writing method according to claim 5, wherein one of the second physical erasing units is sequentially arranged before the at least one first physical erasing unit, and another one of the second physical erasing units is sequentially arranged after the at least one first physical erasing unit.

7. The data writing method according to claim 5, wherein the step of determining whether the remaining space of the second physical erasing units is smaller than the threshold comprises:

determining whether the remaining space of each of the second physical erasing units is smaller than the threshold respectively corresponding to each of the second physical erasing units, wherein the step of selecting the at least one fourth physical erasing unit of the physical erasing units from the spare area and issuing the second writing command sequence is performed if the remaining space in one of the second physical erasing units is smaller than the threshold corresponding to the one of the second physical erasing units.

8. A memory storage device comprising:

a connection interface unit configured to couple to a host system;

a rewritable non-volatile memory module comprising a plurality of physical erasing units, the physical erasing units being at least grouped into a data area and a spare area; and a memory control circuit unit coupled to the connection interface unit and the rewritable non-volatile memory module, wherein the memory control circuit unit is configured to allocate a plurality of logical units, at least one first logical unit of the logical units is mapped to at least one first physical erasing unit of the physical erasing units in the data area, at least one second logical unit of the logical units is mapped to at least one second physical erasing unit of the physical erasing units in the data area, the at least one first physical erasing unit stores first data and is filled with the first data, and the at least one second physical erasing unit stores second data and is not filled with the second data, wherein the memory control circuit unit is further configured to select at least one third physical erasing unit of the physical erasing units from the spare area and determine whether a remaining space in the at least one second physical erasing unit is smaller than a threshold, wherein if the remaining space in the at least one second physical erasing unit is not smaller than the threshold, the memory control circuit unit is further configured to issue a first writing command sequence, wherein the first writing command sequence indicates to write the first data into the at least one third physical erasing unit and indicates to write the second data into the at least one second physical erasing unit, wherein if the remaining space in the at least one second physical erasing unit is smaller than the threshold, the memory control circuit unit is further configured to select at least one fourth physical erasing unit of the physical erasing units from the spare area and issue a second writing command sequence, wherein the second writing command sequence indicates to write the first data into the at least one third physical erasing unit and indicates to write the second data into the at least one second physical erasing unit and the at least one fourth physical erasing unit.

9. The memory storage device according to claim 8, wherein the threshold is equal to a data length of the second data stored in the at least one second logical unit.

10. The memory storage device according to claim 8, wherein the memory control circuit unit is further configured to receive a first writing command from the host system, and the first writing command indicates to write the first data into the at least one first logical unit and indicates to write the second data into the at least one second logical unit,
wherein after receiving the first writing command, the memory control circuit unit is further configured to receive a second writing command from the host system, and the second writing command indicates to write the first data into the at least one first logical unit and indicates to write the second data into the at least one second logical unit,
wherein the operation of selecting the at least one third physical erasing unit from the spare area and determining whether the remaining space in the at least one second physical erasing unit is smaller than the threshold is performed by the memory control circuit unit in response to the second writing command.

11. The memory storage device according to claim 8, wherein a first data writing operation on the at least one first physical erasing unit and the at least one third physical erasing unit is a sequentially writing operation, and a second data writing operation on the at least one second physical erasing unit and the at least fourth physical erasing unit is a randomly writing operation.

12. The memory storage device according to claim 8, wherein the number of the at least one second logical unit is greater than 1, and the number of the at least one second physical erasing unit is greater than 1,
wherein the memory control circuit unit is further configured to map each of the second logical units to one of the second physical erasing units, wherein each of the second physical erasing units stores a portion of the second data.

13. The memory storage device according to claim 12, wherein one of the second physical erasing units is sequentially arranged before the at least one first physical erasing unit, and another one of the second physical erasing units is sequentially arranged after the at least one first physical erasing unit.

14. The memory storage device according to claim 12, wherein the operation of determining whether the remaining space of the second physical erasing units is smaller than the threshold comprises:
determine whether the remaining space of each of the second physical erasing units is smaller than the threshold respectively corresponding to each of the at least one second physical erasing unit,
wherein the operation of selecting the at least one fourth physical erasing unit from the spare area and issuing the second writing command sequence is performed if the remaining space of one of the second physical erasing units is smaller than the threshold corresponding to the one of the second physical erasing unit.

15. A memory control circuit unit configured to control a rewritable non-volatile memory module, wherein the rewritable non-volatile memory module comprises a plurality of physical erasing units, the physical erasing units are at least grouped into a data area and a spare area, and the memory control circuit unit comprises:
a host interface configured to couple to a host system; and
a memory interface configured to couple to the rewritable non-volatile memory module; and
a memory management circuit coupled to the host interface and the memory interface,
wherein the memory management circuit is configured to allocate a plurality of logical units, at least one first logical unit of the logical units is mapped to at least one first physical erasing unit of the physical erasing units in the data area, at least one second logical unit of the logical units is mapped to at least one second physical erasing unit of the physical erasing units in the data area, the at least one first physical erasing unit stores first data and is filled with the first data, and the at least one second physical erasing unit stores second data and is not filled with the second data,
wherein the memory management circuit is further configured to select at least one third physical erasing unit of the physical erasing units from the spare area and determine whether a remaining space in the at least one second physical erasing unit is smaller than a threshold,
wherein if the remaining space in the at least one second physical erasing unit is not smaller than the threshold, the memory management circuit is further configured to issue a first writing command sequence, wherein the first writing command sequence indicates to write the first data into the at least one third physical erasing unit and indicates to write the second data into the at least one second physical erasing unit,
wherein if the remaining space in the at least one second physical erasing unit is smaller than the threshold, the memory management circuit is further configured to select at least one fourth physical erasing unit of the physical erasing units from the spare area and issue a second writing command sequence, wherein the second writing command sequence indicates to write the first data into the at least one third physical erasing unit and indicates to write the second data into the at least one second physical erasing unit and the at least one fourth physical erasing unit.

16. The memory control circuit unit according to claim 15, wherein the threshold is equal to a data length of the second data stored in the at least one second logical unit.

17. The memory control circuit unit according to claim 15, wherein the memory management circuit is further configured to receive a first writing command from the host system, and the first writing command indicates to write the first data into the at least one first logical unit and indicates to write the second data into the at least one second logical unit,
wherein after receiving the first writing command, the memory management circuit is further configured to receive a second writing command from the host system, and the second writing command indicates to write the first data into the at least one first logical unit and indicates to write the second data into the at least one second logical unit,
wherein the operation of selecting the at least one third physical erasing unit from the spare area and determining whether the remaining space in the at least one second physical erasing unit is smaller than the threshold is performed by the memory management circuit in response to the second writing command.

18. The memory control circuit unit according to claim 15, wherein a first data writing operation on the at least one first physical erasing unit and the at least one third physical erasing unit is a sequentially writing operation, and a second data writing operation on the at least one second physical erasing unit and the at least fourth physical erasing unit is a randomly writing operation.

19. The memory control circuit unit according to claim 15, wherein the number of the at least one second logical unit is greater than 1, and the number of the at least one second physical erasing unit is greater than 1,
    wherein the memory management circuit is further configured to map each of the second logical units to one of the second physical erasing units, wherein each of the second physical erasing units stores a portion of the second data.

20. The memory control circuit unit according to claim 19, wherein one of the second physical erasing units is sequentially arranged before the at least one first physical erasing unit, and another one of the second physical erasing units is sequentially arranged after the at least one first physical erasing unit.

21. The memory control circuit unit according to claim 19, wherein the operation of determining whether the remaining space of the second physical erasing units is smaller than the threshold comprises:
    determining whether the remaining space of each of the second physical erasing units is smaller than the threshold respectively corresponding to each of the second physical erasing units,
    wherein the operation of selecting the at least one fourth physical erasing unit from the spare area and issuing the second writing command sequence is performed if the remaining space of one of the second physical erasing units is smaller than the threshold corresponding to the one of the second physical erasing units.

\* \* \* \* \*